(12) United States Patent
Chen

(10) Patent No.: US 11,031,272 B2
(45) Date of Patent: *Jun. 8, 2021

(54) MICRO DEVICE ELECTROSTATIC CHUCK WITH DIFFUSION BLOCKING LAYER

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 243 days.

This patent is subject to a terminal disclaimer.

(21) Appl. No.: 16/181,364

(22) Filed: Nov. 6, 2018

(65) Prior Publication Data

US 2020/0144941 A1    May 7, 2020

(51) Int. Cl.
*H02N 13/00* (2006.01)
*H01L 21/683* (2006.01)
(Continued)

(52) U.S. Cl.
CPC .......... *H01L 21/6833* (2013.01); *B32B 15/08* (2013.01); *B32B 27/20* (2013.01); *H02N 13/00* (2013.01)

(58) Field of Classification Search
CPC .......... B23Q 3/15; B32B 15/08; B32B 27/20; B60L 2240/547; B60L 2240/549; B60L 2260/26; B60L 3/0046; B60L 3/12; B60L 50/40; B60L 50/64; B60L 58/10; B81C 99/002; C04B 2235/3206; C04B 2235/3208; C04B 2235/3213; C04B 2235/3215; C04B 2235/3227; C04B 2235/3246; C04B 2235/445; C04B 2235/656; C04B 2235/662; C04B 2235/77; C04B 2235/785; C04B 2235/85; C04B 2235/96; C04B 35/505; C04B 35/62685; C04B 35/645; C23C 16/4581; C23C 16/4586; H01J 37/32715; H01L 21/3065; H01L 21/67098; H01L 21/67109;
(Continued)

(56) References Cited

U.S. PATENT DOCUMENTS 4,480,284 A * 10/1984 Tojo .................... H01L 21/6833
                                                                 269/8
5,729,423 A *  3/1998 Donde ................ H01L 21/6831
                                                                 361/234
(Continued)

FOREIGN PATENT DOCUMENTS

EP          0635869 A1 *  1/1995    ......... H01L 21/6831
KR     20090019414 A  *  2/2009

*Primary Examiner* — Jared Fureman
*Assistant Examiner* — Nicolas Bellido
(74) *Attorney, Agent, or Firm* — CKC & Partners Co., LLC

(57) ABSTRACT

An electrostatic chuck including a body, an electrode, a diffusion blocking layer, and a composite dielectric layer is provided. The electrode is present on the body. The diffusion blocking layer is present on the electrode. The composite dielectric layer is present on the diffusion blocking layer. The composite dielectric layer includes a polymer layer and a plurality of inorganic dielectric particles. The plurality of inorganic dielectric particles is distributed within the polymer layer, and a permittivity of the inorganic dielectric particles is greater than a permittivity of the polymer layer.

17 Claims, 4 Drawing Sheets

(51) Int. Cl.
*B32B 15/08* (2006.01)
*B32B 27/20* (2006.01)

(58) Field of Classification Search
CPC ........... H01L 21/67144; H01L 21/6831; H01L 21/6833; H01L 21/68757; H02N 13/00; Y10T 279/23; Y10T 428/256
See application file for complete search history.

(56) References Cited

U.S. PATENT DOCUMENTS

| | | | | |
|---|---|---|---|---|
| 5,751,537 | A | * | 5/1998 | Kumar ................. H01L 21/6833 361/234 |
| 7,701,693 | B2 | * | 4/2010 | Hattori ................. C04B 37/001 361/234 |
| 9,644,269 | B2 | * | 5/2017 | Stone ................. C23C 16/50 |
| 10,497,598 | B2 | * | 12/2019 | Cooke ................. H01L 21/6831 |
| 10,665,493 | B1 | * | 5/2020 | Chen ................. H02N 13/00 |
| 2009/0242544 | A1 | * | 10/2009 | Kano ................. H01L 21/6831 219/444.1 |
| 2015/0214087 | A1 | * | 7/2015 | Stone ................. C23C 28/044 361/234 |
| 2020/0144942 | A1 | * | 5/2020 | Chen ................. H02N 13/00 |

* cited by examiner

US 11,031,272 B2

MICRO DEVICE ELECTROSTATIC CHUCK WITH DIFFUSION BLOCKING LAYER

BACKGROUND

Field of Invention

The present disclosure relates to an electrostatic chuck for picking up a micro device through an electrostatic pressure.

Description of Related Art

The statements in this section merely provide background information related to the present disclosure and do not necessarily constitute prior art.

In recent years, micro devices have become popular in various applications. Among all technical aspects of micro devices, transfer process is one of the most challenging tasks for micro devices to be commercialized. One of the important issues of the transfer process is the design of electrostatic chucks.

SUMMARY

According to some embodiments of the present disclosure, an electrostatic chuck including a body, an electrode, a diffusion blocking layer, and a composite dielectric layer is provided. The electrode is present on the body. The diffusion blocking layer is present on the electrode. The composite dielectric layer is present on the diffusion blocking layer. The composite dielectric layer includes a polymer layer and a plurality of inorganic dielectric particles. The plurality of inorganic dielectric particles is distributed within the polymer layer, and a permittivity of the inorganic dielectric particles is greater than a permittivity of the polymer layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
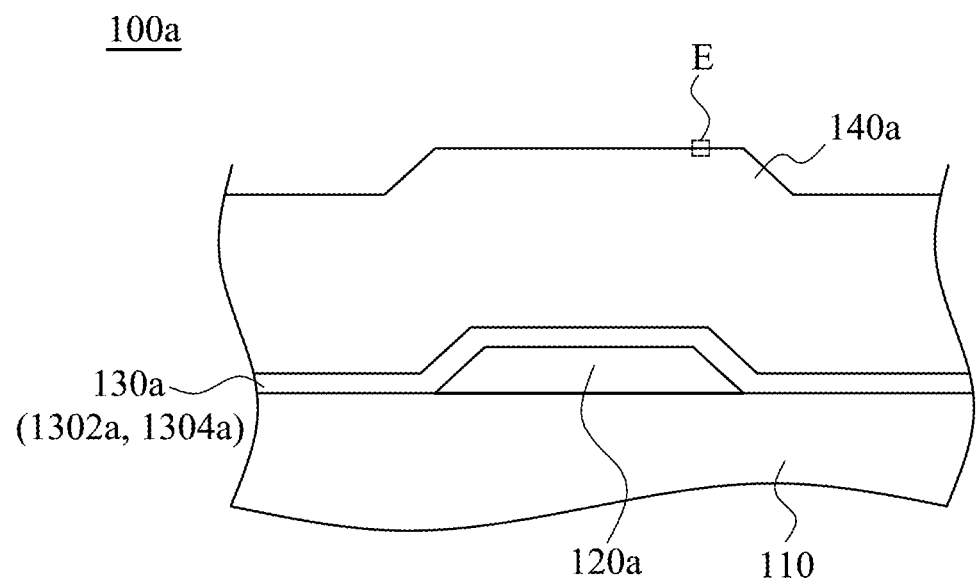
FIG. 1A is a cross-sectional view of an electrostatic chuck according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1B:
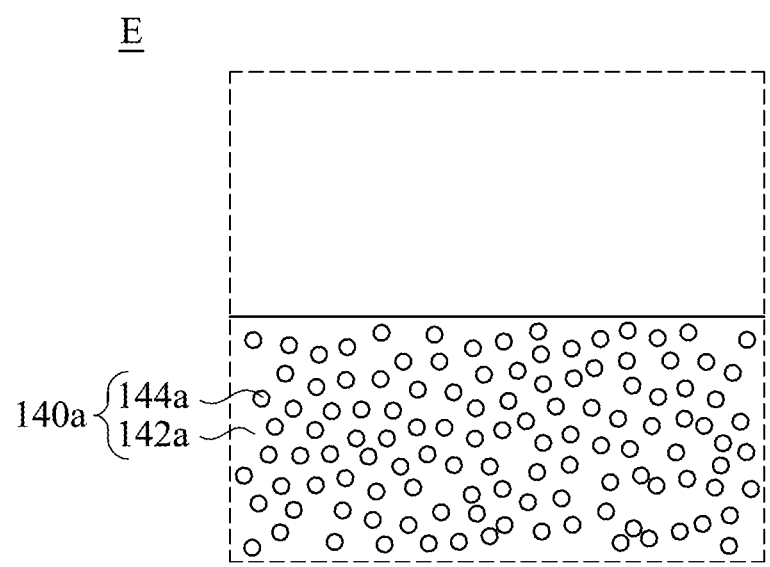
FIG. 1B is an enlarged cross-sectional view of a portion of a composite dielectric layer according to some embodiments of the present disclosure.

References are made to FIGS. 1A and 1B. FIG. 1A is a cross-sectional view of an electrostatic chuck 100a according to some embodiments of the present disclosure. FIG. 1B is an enlarged cross-sectional view of a portion of a composite dielectric layer 140a according to some embodiments of the present disclosure. In some embodiments, an electrostatic chuck 100a including a body 110, an electrode 120a, a diffusion blocking layer 130a, and a composite dielectric layer 140a is provided. Although most of terms described in the following disclosure use singular nouns, said terms may also be plural in accordance with figures or practical applications.

The electrode 120a is present on the body 110. In some embodiments, the electrode 120a includes copper (Cu), but should not be limited thereto. The body 110 may include a variety of materials such as silicon, ceramic, glass, or quartz, which are capable of providing structural support. The diffusion blocking layer 130a is present on and covers the electrode 120a. In some embodiments, the electrode 120a is wrapped by the diffusion blocking layer 130a and the body 110. The composite dielectric layer 140a is present on the diffusion blocking layer 130a. In some embodiments, the diffusion blocking layer 130a can be formed by atomic layer deposition (ALD), thermal deposition, molecular beam epitaxy (MBE), electron gun evaporation (e-gun evaporation), or sputtering, chemical vapor deposition (CVD), or physical vapor deposition (PVD). Since atoms which constitute the electrode 120a may be strongly diffusive (e.g., copper (Cu) atoms) even at room temperature, the presence of the diffusion blocking layer 130a can prevent those atoms from diffusing through the composite dielectric layer 140a to cause a current leakage from the electrode 120a to a micro device to be picked up. In some embodiments, the diffusion blocking layer 130a includes at least one metal layer 1302a or at least one alloy layer 1304a, and the at least one metal layer 1302a or the at least one alloy layer 1304a can include one or more than one of elements selected from palladium (Pd), platinum (Pt), nickel (Ni), molybdenum (Mo), Vanadium (V), ruthenium-tantalum-nitrogen (Ru—Ta—N), titanium nitride (TiN), tungsten titanium (TiW), and molybdenum nitride (MoN), but should not be limited thereto. In some embodiments, the diffusion blocking layer 130a includes not only said metal layer 1302a or said alloy layer 1304a, but further includes at least one inorganic layer. The at least one inorganic layer can include silicon nitride ($SiN_x$), aluminium oxide ($Al_2O_3$), hafnium dioxide ($HfO_2$), or indium trioxide ($In_2O_3$), but should not be limited thereto.

The composite dielectric layer 140a includes a polymer layer 142a and a plurality of inorganic dielectric particles 144a, as shown in FIG. 1B which is an enlarged view of the portion E in FIG. 1A. The inorganic dielectric particles 144a are distributed within the polymer layer 142a. Specifically, the polymer layer 142a can be a polymer matrix which can be made by crosslinking polymers, and the inorganic dielectric particles 144a are embedded in the polymer matrix. The volume ratio of the polymer layer 142a and the inorganic dielectric particles 144a of the composite dielectric layer 140a shown FIG. 1B is only schematic. The polymer layer 142a can be polymethyl methacrylate (PMMA), polydimethylsiloxane (PDMS), or epoxy, but should not be limited thereto. The inorganic dielectric particles 144a can include titanium dioxide ($TiO_2$), barium titanate ($BaTiO_3$), zirconium dioxide ($ZrO_2$), or combinations thereof. In some embodiments, the composite dielectric layer 140a is made by first mixing the inorganic dielectric particles 144a into the polymer layer 142a, and then using a process such as spin-coating, slit-coating, or inkjet printing to form the composite dielectric layer 140a on the diffusion blocking layer 130a.

Figure 1C:
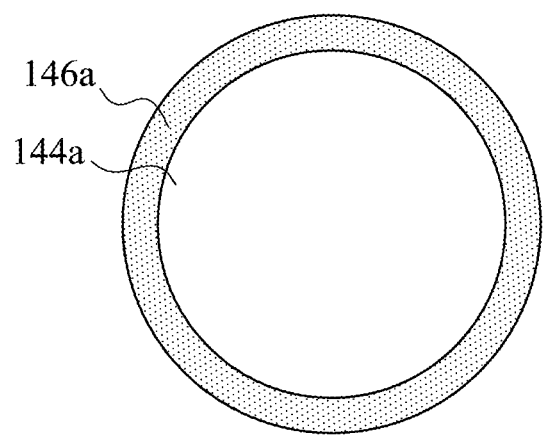
FIG. 1C is a cross-sectional view of an inorganic dielectric particle according to some embodiments of the present disclosure.

Reference is made to FIG. 1C. FIG. 1C is a cross-sectional view of an inorganic dielectric particle 144a according to some embodiments of the present disclosure. In some embodiments, each of the inorganic dielectric particles 144a is coated with a metal 146a thereon, and is wrapped by said metal 146a, so as to enhance dipole moments of each of the inorganic dielectric particles 144a, and hence the electrostatic pressure exerted by the electrostatic chuck 100a to the micro device to be picked up can be further enhanced. In some embodiments, an average diameter of the inorganic dielectric particles 144a is smaller than a size of a micro device to be picked up by the electrostatic chuck 100a, such as equal to or smaller than 100 nanometers, so as to provide a substantially uniform electrostatic pressure to said micro device.

Figure 2:
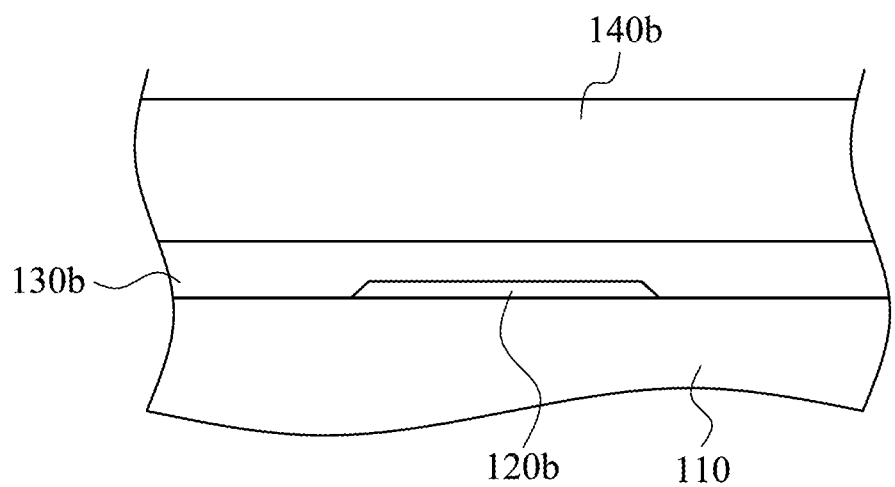
FIG. 2 is a cross-sectional view of an electrostatic chuck according to some embodiments of the present disclosure.

Reference is made to FIG. 2. FIG. 2 is a cross-sectional view of an electrostatic chuck 100b according to some embodiments of the present disclosure. Differences between the electrostatic chuck 100b and the electrostatic chuck 100a are that, the diffusion blocking layer 130b has a substantially flat surface facing away from the electrode 120b as shown in FIG. 2, while a surface of the diffusion blocking layer 130a facing away from the electrode 120a has a raised platform above the electrode 120a as shown in FIG. 1A. Similarly, the composite dielectric layer 140b has a substantially flat surface facing away from the electrode 120b, while a surface of the composite dielectric layer 140a facing away from the electrode 120a has a raised platform above the electrode 120a. The above differences may come from different thicknesses between the electrode 120a and the electrode 120b, but should not be limited thereto.

Figure 3:
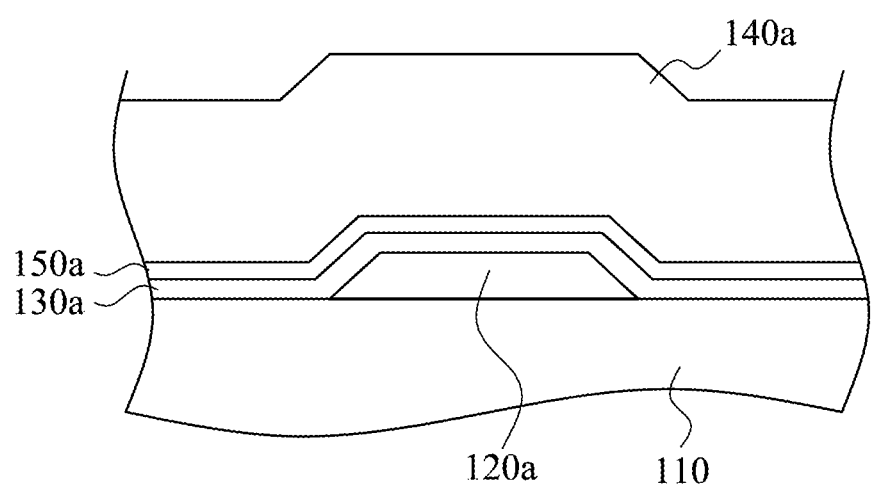
FIG. 3 is a cross-sectional view of an electrostatic chuck according to some embodiments of the present disclosure.

Reference is made to FIG. 3. FIG. 3 is a cross-sectional view of an electrostatic chuck 100c according to some embodiments of the present disclosure. In some embodiments, the electrostatic chuck 100c further includes at least one dielectric layer 150a present between the composite dielectric layer 140a and the diffusion blocking layer 130a. In some embodiments, the dielectric layer 150a includes teflon, epoxy, or combinations thereof. In some embodiments, the dielectric layer 150a includes an inorganic material, such as silicon nitride ($SiN_x$), hafnium oxide ($HfO_2$), silicon dioxide ($SiO_2$), or combinations thereof.

In some embodiments, a thickness of the composite dielectric layer 140a is greater than a thickness of the dielectric layer 150a, so as to increase a breakdown voltage of the electrostatic chuck 100c. Besides, the thicker composite dielectric layer 140a can be less sensitive to an air gap between the composited dielectric layer 140a and the micro device to be picked up when the applied voltage increases. Furthermore, the thicker dielectric layer 140a can prevent the dielectric layer 150a from scratches. In some embodiments, a thickness of the composite dielectric layer 140a ranges from about 0.2 μm to about 100 μm. In some embodiments, a thickness of the composite dielectric layer 140a ranges from about 1 μm to about 10 μm.

In some embodiments, a permittivity of the inorganic dielectric particles 144a is greater than a permittivity of the polymer layer 142a, such that an equivalent permittivity of the composite dielectric layer 140a can be enhanced compared to a permittivity of the composite dielectric layer 140a without the inorganic dielectric particles 144a (i.e., compared to the case with only the polymer layer 142a constituting the composite dielectric layer 140a). In some embodiments, a material of the polymer layer 142a has a permittivity about 1.4 to 1.5 times the vacuum permittivity (i.e., a dielectric constant of the polymer layer 142a is about 1.4 to 1.5). In some embodiments, a material of the inorganic dielectric particles 144a has a permittivity more than two decades of the vacuum permittivity (i.e., a dielectric constant of the inorganic dielectric particles 144a is more than 20). In some embodiments, an equivalent permittivity of the composite dielectric layer 140a is greater than 6 times of the vacuum permittivity by tuning a ratio of the total volume of the polymer layer 142a to the total volume of the inorganic dielectric particles 144a. As such, the composite dielectric layer 140a not only can prevent the electrostatic chuck 100c from scratches when picking up a micro device due to its pliable surface formed by the polymer layer 142a (i.e., a hardness of the dielectric layer 150a is greater than a hardness of the composite dielectric layer 140a), but also have a sufficiently high permittivity to exert an electrostatic pressure which is high enough to stably transfer a micro device.

In some embodiments, a resistivity of the dielectric layer 150a is greater than a resistivity of the composite dielectric layer 140a, so as to prevent a possible current leakage from the electrode 120a and the diffusion blocking layer 130a to a contact surface between the composite dielectric layer 140a and the micro device to be picked up.

With the configuration such as embodiments illustrated by FIG. 3, a combination of the dielectric layer 150a and the composite dielectric layer 140a can have several benefits. First, since the polymer layer 142a of the composite dielectric layer 140a is generally pliable (e.g., PMMA) compared to a micro device to be picked up, the polymer layer 142a can prevent the electrostatic chuck 100c from scratches, thus preventing failure of picking up. The polymer layer 142a also reveals better contact with the micro device to be picked up. However, soft materials often have lower permittivities, and thus an electrostatic pressure exerted by the electrostatic chuck with a soft material thereon (e.g. said polymer layer 142a) to the micro device is also lower compared to dielectric materials having greater hardness (e.g., silicon nitride). In order to enhance the electrostatic pressure while keeping a pliable contact between the electrostatic chuck 100c and the micro device, the inorganic dielectric particles 144a having a higher permittivity compared to the polymer layer 142a are introduced and mixed in the polymer layer 142a to enhance the equivalent permittivity of the composite dielectric layer 140a. However, the introduction of the inorganic dielectric particles 144a tends to increase the occurrence of local charge accumulations, such charge accumulations may cause the inorganic dielectric particles 144a to form channels and cause current leakages. Therefore, the dielectric layer 150a with a higher resistivity compared to the composite dielectric layer 140a is present to solve the current leakage phenomenon of the channels formed by the inorganic dielectric particles 144a.

Figure 4:
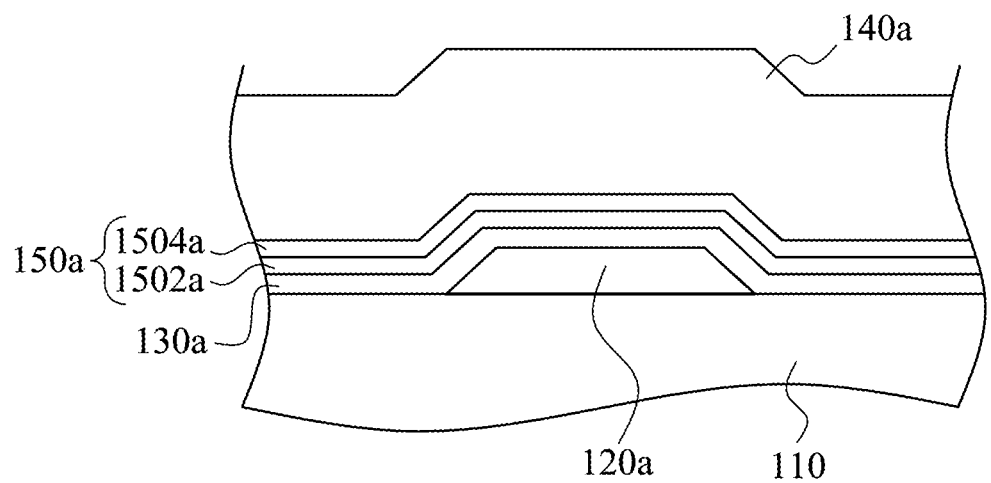
FIG. 4 is a cross-sectional view of an electrostatic chuck according to some embodiments of the present disclosure.

Reference is made to FIG. 4. FIG. 4 is a cross-sectional view of an electrostatic chuck 100d according to some embodiments of the present disclosure. In some embodiments, a number of the dielectric layer 150a is plural. For example, in FIG. 4 the dielectric layer 150a includes a first dielectric layer 1502a and a second dielectric layer 1504a. The first dielectric layer 1502a is present on and in contact with the diffusion blocking layer 130a. The second dielectric layer 1504a is present and stacked on the first dielectric layer 1502a. The first and second dielectric layers 1502a, 1504a may include two of the materials selected from silicon nitride ($SiN_x$), hafnium dioxide ($HfO_2$), Silicon dioxide ($SiO_2$), tantalum pentoxide ($Ta_2O_5$), titanium dioxide ($TiO_2$), zirconium dioxide ($ZrO_2$), aluminium oxide ($Al_2O_3$), teflon, and epoxy respectively, but should not be limited thereto. Although in FIG. 4 the dielectric layer 150a has a raised platform, in some other embodiments, such as embodiments with thinner electrode 120a (e.g., replacing the electrode 120a with the electrode 120b, similar to the embodiments illustrated by FIG. 2), the dielectric layer 150a can also have a substantially flat surface facing away from the electrode 120a (or 120b).

Figure 5:
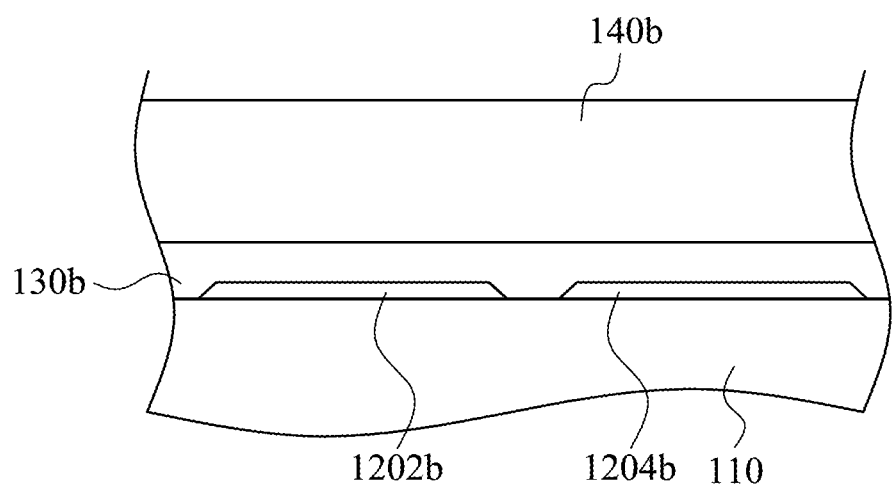
FIG. 5 is a cross-sectional view of an electrostatic chuck according to some embodiments of the present disclosure.

Reference is made to FIG. 5. FIG. 5 is a cross-sectional view of an electrostatic chuck 100e according to some embodiments of the present disclosure. In some embodiments, the electrostatic chuck 100e can include two electrodes (e.g., a first electrode 1202b and a second electrode 1204b) present between the diffusion blocking layer 130b and the body 110. The second electrode 1204b is adjacent to and electrically isolated from the electrode 1202b. In some embodiments, the electrodes 1202b and 1204b can be bipolar electrodes. That is, different voltages are respectively applied to the electrodes 1202b and 1204b for picking up the micro device. In some embodiments, voltages applied to the electrodes 1202b and 1204b can be a positive voltage and a negative voltage respectively to enhance and stabilize the electrostatic pressure for picking up the micro device. Besides, the bipolar electrodes can have two-phase and multi-phase when alternating currents is applied to the electrodes 1202b and 1204b. Specifically, bipolar electrodes are more capable of picking up an insulator or an ungrounded object (or an electrostatically floated object).

In summary, embodiments of the present disclosure provide an electrostatic chuck for picking up a micro device through an electrostatic pressure. A diffusion blocking layer is present between a composite dielectric layer and an electrode, so as to prevent atoms of the electrode from diffusing through the composite dielectric layer to another surface of the composite dielectric layer on a side opposite to the electrode, and thus a current leakage is avoided. In some embodiments, a dielectric layer with a high resistivity is present between the composite dielectric layer and the diffusion blocking layer. As such, not only said diffusion can be avoided, but also a current leakage caused by charge accumulations of the electrostatic chuck can be prevented when a transferring process is conducted, while an electrostatic pressure can be stable and kept high enough.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrostatic chuck, comprising:
   a body;
   an electrode disposed on the body;
   a diffusion blocking layer disposed on the electrode; and
   a composite dielectric layer disposed on the diffusion blocking layer, comprising:
      a polymer layer; and
      a plurality of inorganic dielectric particles distributed within the polymer layer, a permittivity of the inorganic dielectric particles being greater than a permittivity of the polymer layer.

2. The electrostatic chuck of claim 1, wherein the diffusion blocking layer comprises at least one metal layer, and the at least one metal layer comprises palladium (Pd), platinum (Pt), nickel (Ni), or molybdenum (Mo).

3. The electrostatic chuck of claim 1, wherein the diffusion blocking layer comprises at least one alloy layer, and the at least one alloy layer comprises at least one of palladium (Pd), platinum (Pt), nickel (Ni), or molybdenum (Mo).

4. The electrostatic chuck of claim 3, wherein the diffusion blocking layer further comprises at least one inorganic layer, wherein the at least one inorganic layer comprises silicon nitride ($SiN_x$), aluminium oxide ($Al_2O_3$), hafnium dioxide ($HfO_2$), or indium trioxide ($In_2O_3$).

5. The electrostatic chuck of claim 1, wherein the electrode is wrapped by the diffusion blocking layer and the body.

6. The electrostatic chuck of claim 1, wherein the electrode comprises copper (Cu).

7. The electrostatic chuck of claim 1, further comprising a second electrode disposed between the diffusion blocking layer and the body, wherein the second electrode is adjacent to and electrically isolated from the electrode.

8. The electrostatic chuck of claim 1, wherein the inorganic dielectric particles comprise titanium dioxide ($TiO_2$), zirconium dioxide ($ZrO_2$), or barium titanate ($BaTiO_3$).

9. The electrostatic chuck of claim 1, wherein each of the inorganic dielectric particles is coated with a metal thereon, and is wrapped by the metal.

10. The electrostatic chuck of claim 1, further comprising:
   at least one dielectric layer disposed between the composite dielectric layer and the diffusion blocking layer.

11. The electrostatic chuck of claim 10, wherein a resistivity of the at least one dielectric layer is greater than a resistivity of the composite dielectric layer.

12. The electrostatic chuck of claim 10, wherein a hardness of the at least one dielectric layer is greater than a hardness of the composite dielectric layer.

13. The electrostatic chuck of claim 10, wherein the at least one dielectric layer comprises an inorganic material.

14. The electrostatic chuck of claim 10, wherein the at least one dielectric layer comprises silicon nitride (SiNx), Hafnium dioxide (HfO2), silicon dioxide (SiO2), or combinations thereof.

15. The electrostatic chuck of claim 10, wherein the at least one dielectric layer comprises teflon, epoxy, or a combination thereof.

16. The electrostatic chuck of claim 10, wherein a number of the at least one dielectric layer is plural.

17. The electrostatic chuck of claim 10, wherein a thickness of the composite dielectric layer is greater than a thickness of the at least one dielectric layer.

* * * * *